US007567898B2

(12) United States Patent
Bennett

(10) Patent No.: US 7,567,898 B2
(45) Date of Patent: Jul. 28, 2009

(54) REGULATION OF VOLUME OF VOICE IN CONJUNCTION WITH BACKGROUND SOUND

(75) Inventor: James D. Bennett, San Clemente, CA (US)

(73) Assignee: Broadcom Corporation, Irvine, CA (US)

( * ) Notice: Subject to any disclaimer, the term of this patent is extended or adjusted under 35 U.S.C. 154(b) by 617 days.

(21) Appl. No.: 11/189,419

(22) Filed: Jul. 26, 2005

(65) Prior Publication Data

US 2007/0027682 A1 Feb. 1, 2007

(51) Int. Cl.

*G10L 19/14* (2006.01)
*G10L 21/00* (2006.01)
*G10L 19/00* (2006.01)
*H03G 3/00* (2006.01)

(52) U.S. Cl. ........................ 704/225; 704/278; 704/500; 381/107

(58) Field of Classification Search ........................ None
See application file for complete search history.

(56) References Cited

U.S. PATENT DOCUMENTS 5,569,038 A * 10/1996 Tubman et al. ............. 434/308
5,646,931 A * 7/1997 Terasaki ................ 369/124.08
5,917,781 A * 6/1999 Kim .............................. 369/4
6,711,258 B1 * 3/2004 Sung ...................... 379/390.01
7,337,111 B2 * 2/2008 Vaudrey et al. ............. 704/225
2004/0218768 A1 * 11/2004 Zhurin et al. ............... 381/107

FOREIGN PATENT DOCUMENTS

WO WO9953612 * 10/1999

* cited by examiner

*Primary Examiner*—Matthew J Sked
(74) *Attorney, Agent, or Firm*—Garlick Harrison & Markison; Bruce E. Garlick

(57) ABSTRACT

An audio information processing system, which when incorporated in home audio video systems, provides independent volume control capability, independent equalization setting capability and independent special effects capability of voice and background sound, to the home audio-video system. The audio information processing system receives an audio signal and extracts there from a voice signal and a background signal based upon correlation of language tracks, correlation of a center channel with surround sound channels, via a voice detection circuit, or via other means. Once the voice signal and background signal are determined, separate processing is performed, and combining of the separately processed voice and background signals may be performed.

30 Claims, 8 Drawing Sheets

505

REGULATION OF VOLUME OF VOICE IN CONJUNCTION WITH BACKGROUND SOUND

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

1. Field of the Invention

This invention generally relates to audio-video systems.

2. Related Art

Audio/video (AV) systems are in widespread use. These audio/video systems include a video display, typically a television screen, and an associated sound system. The audio/video source for such systems may be a Cable, Satellite or Fiber Set-Top-Box (STB), an antenna, a digital videodisk, a Personal Video Recorder (PVR), a computer network, and the Internet, among other sources.

Most programming, e.g., movies, sporting event presentations, and other programming, include both voice and background information. The relative volume of the voice to the background typically varies over the duration of the program. For example, movie programming often include dialogue scenes that are mostly voice and action scenes that are mostly background and that include voice. To understand the programming, a user must be able to understand the voice. Thus, when the voice level is too low, a user increases the volume of the presentation to understand the voice content. Raising the volume increases both the volume of the voice and the volume of the background, which produces a loud combined voice/background presentation. This situation of loud audio output is unacceptable for people who live in apartments or in cities with houses in close proximity.

For example, users who are watching a movie on a television and a coupled surround sound audio system often find that the conversations are inaudible while loud background sounds such as background music, loud noises in the background or special effect sounds in the background is going on. Users who raise the volume in order to listen to the voice conversations find that the volume of the entire audio spectrum increases. This loud audio output disturbs neighbors, sleeping family members, and children who are studying their school works and makes them complain about it.

Further limitations and disadvantages of conventional and traditional approaches will become apparent to one of ordinary skill in the art through comparison of such systems with the present invention.

BRIEF SUMMARY OF THE INVENTION

The present invention is directed to apparatus and methods of operation that are further described in the following Brief Description of the Drawings, the Detailed Description of the Invention, and the Claims. Features and advantages of the present invention will become apparent from the following detailed description of the invention made with reference to the accompanying drawings.

DETAILED DESCRIPTION OF THE INVENTION

The present invention relates generally to home audio-video systems and the following description involves the application of the present invention to a home audio-video system. Although the following description relates in particular to the application of the present invention to a home audio-video system, it should be clear that the teachings of the present invention might be applied to other types of audio-video systems and to audio systems alone.

Figure 1:
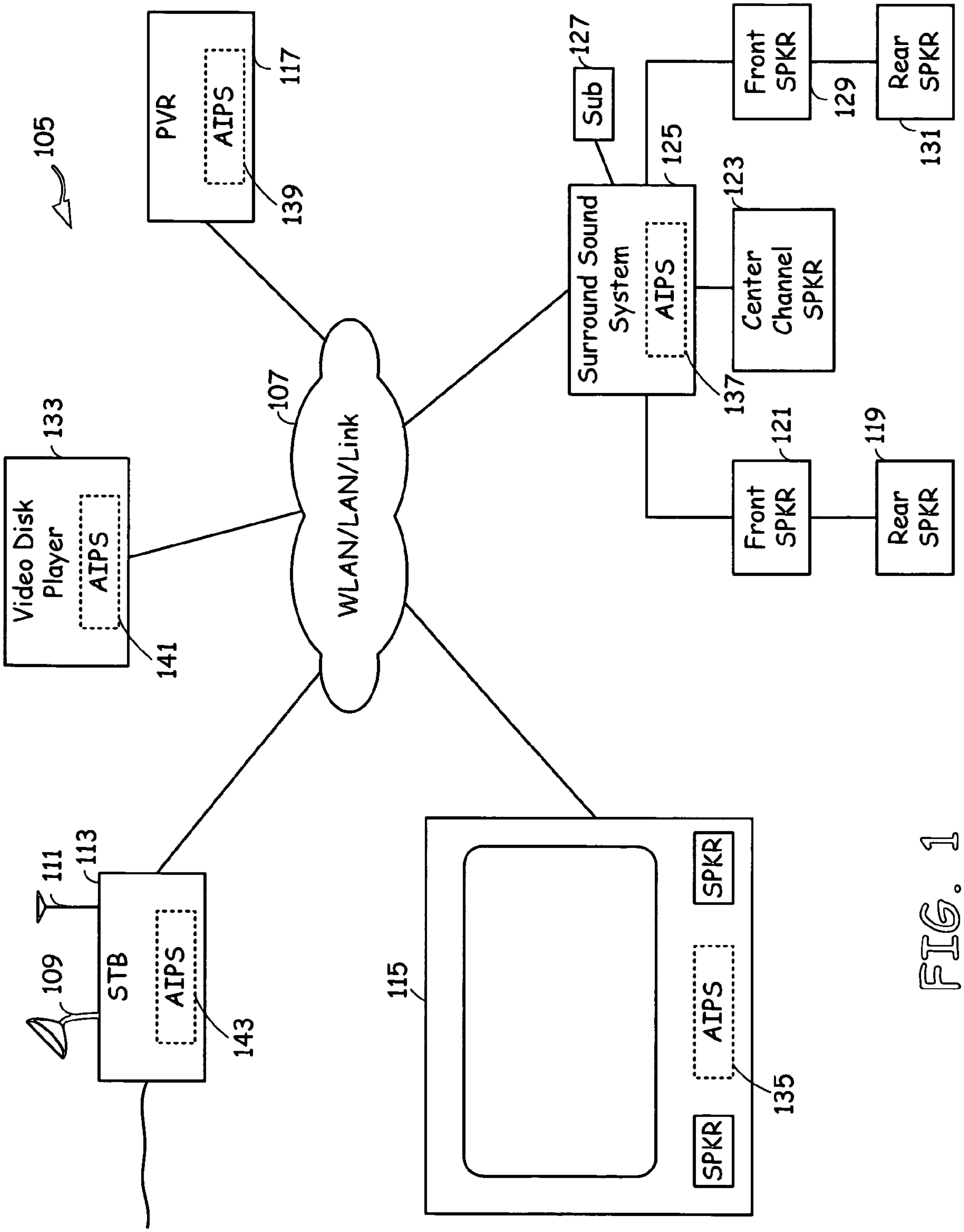
FIG. 1 is a block diagram illustrating an embodiment of an audio information processing system (AIPS) according to the present invention that is incorporated into a home audio-video system.

FIG. 1 is a block diagram illustrating an embodiment of an audio information processing system (AIPS) according to the present invention that is incorporated into a home audio-video system. The AIPS includes one or more components 135, 137, 139, 141, and 143 that are incorporated into one or more components of a typical home audio-video system 105. The typical home audio-video system 105 includes a set top box (STB) 113, a videodisk player 133, a personal video recorder (PVR) 117, a surround sound system 125, and/or a television 115. The home audio-video system 105 components 113, 115, 117, 125, and 133 communicatively couple to one another via a wireless local area network (WLAN), a local area network (LAN), and/or wired or wireless point-to-point link 107.

Although each of the components 135, 137, 139, 141, and 143 contains full AIPS audio processing functionality, via circuitry and processing operations, full AIPS functionality might also be distributed in portions across two or more of the components 135, 137, 139, 141, and 143. Further, the AIPS may also include a separate piece of equipment (not shown) that provides dedicated AIPS functionality or separate computer (not shown) running software tailored to perform AIPS processing.

The AIPS independently operates upon voice portions and background portions of audio information, and later combines the portions for presentation via speakers. If not previously segregated into separate voice and background portions upon receipt, the audio information is segregated by the AIPS before performing these independent operations. The AIPS typically performs the segregation and independent operations on digital audio information, although analog processing could be used. The audio information received by the AIPS is usually received in an unsegregated digital form. The audio information may also be in unsegregated analog, segregated digital and segregated analog forms. With the present embodiment, when used with segregated and unsegregated analog audio, the AIPS converts the analog audio to a digital form before performing further segregation and independent operations.

One or more of the STB 113, the videodisk player 133, the PVR 117, the television 115 or the surround sound system are sources of the audio information. Specifically, the STB 113 delivers AIPS processed audio-video information received via any one or more of a WLAN, a LAN, a cable television network, a dish antenna 109, and another antenna 111. The videodisk player 133 and the PVR 117 delivers AIPS processed audio-video information retrieved from local storage. Audio-video information, whether or not processed by the AIPS, may also be retrieved from another location accessible via the WLAN/LAN/link 107 or from an Internet based remote server (not shown). Before, during and after receipt of audio-video information, the AIPS processes the audio portion of the audio-video information according to the present invention and prior to presentation to a user.

Unless segregation of the audio input has been done beforehand, the AIPS segregates the audio input into a voice signal and a background signal. The voice signal and the background signal then undergo independent audio processing. Exemplary types of independent audio processing include equalization, special effects processing, and gain control, which are used to produce a processed voice signal and a processed background signal. The processed voice signal and the processed background signal may then be combined to form a processed audio signal, which may then be presented in the combined format.

Once the processed voice signal and the processed background signal have been combined, the combined audio signal may be routed for storage or presentation. Routing for presentation may include routing the processed audio signal to one or both of the television 115 and the surround sound system 125 for presentation via speakers. Routing for storage and later playback may involve storage locally on the PVR 117 or at a remote location, for example.

The home theatre system 105 provides audio-visual experiences that are comparable to that of a cinema theatre. The surround sound system 125 typically consists of multiple speakers such as a sub woofer 127 usually placed in the front of the hall, a center channel speaker 123 placed in the front-center of the hall, two front speakers 121, 129 placed in the front-left and front-right of the hall and two rear speakers 119, 131 placed in the rear-left and rear-right of the hall. The surround sound system 125 may provide the audio for the television 115. According to one operation of the present invention, the processed audio signal is presented via the surround sound system 125. According to another operation of the present invention, the processed voice signal and the processed background signal are separately provided to the surround sound system 125 and the surround sound system 125 separately presents the processed voice signal and the processed background signal. For example, the surround sound system 125 may present the processed audio signal via the center channel speaker 123 and the processed background signal via the front and rear speakers 119, 121, 129, and 131.

According to an aspect of the present invention, a user may independently control volume levels, equalization of, and surround sound processing of voice signals and background signals via: 1) buttons of a remote control; 2) control operations of the surround sound system 125; 3) buttons on the television set 135; and 4) other control mechanisms. In such case, as will be described further with reference to FIG. 5, the user may enter these separate settings via a remote control that operates according to the present invention.

When there is a plurality of fully functioning AIPS in the pathway between the original audio capture and the audio speakers, the AIPS functionality of the present invention works in one of several modes. In a first mode, each device or component applying full AIPS functionality will do so without regard to whether prior AIPS processing has occurred. In a second mode, the application of AIPS will be communicated downstream such that the AIPS processing will only take place once—upstream. In a third mode, a downstream AIPS will disable all upstream AIPS processing such that the AIPS processing takes place once—downstream. In a fourth mode, all AIPS parameters, such as user settings of each AIPS component or equipment, will be combined for processing on one or more of the AIPS systems and to simplify a user's control interface over the independent audio processing. For example, in the fourth mode, an upstream AIPS communicates with a downstream AIPS (shown in FIG. 1) for the purpose of providing settings of proportionate volumes of voice and background and equalization settings to the downstream AIPS. The downstream AIPS negotiates sole or shared processing or negate double processing. Although preset in the first mode as a factory default, users may change the setting by selecting another, desired mode.

Figure 2A:
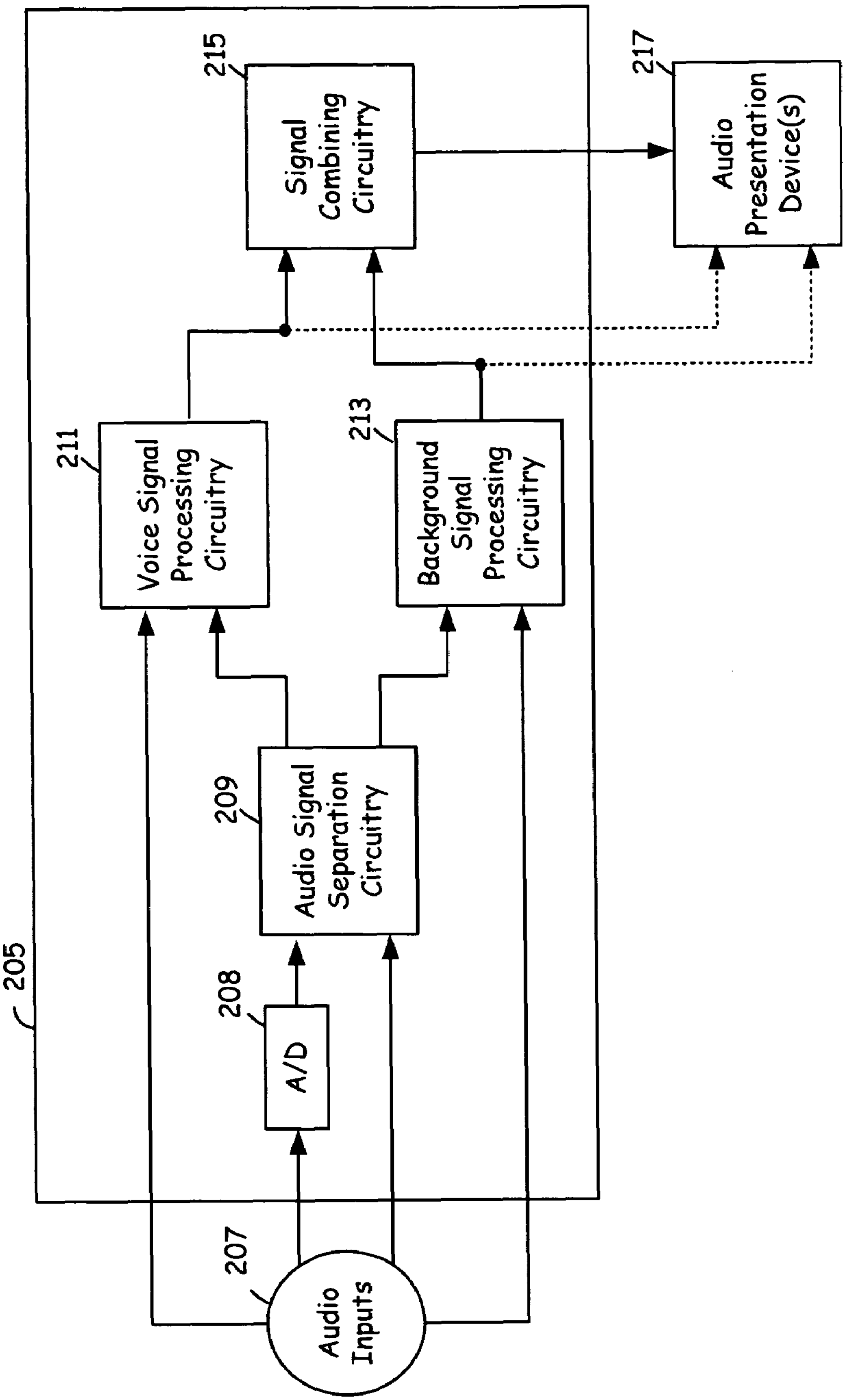
FIG. 2A is an block diagram illustrating the functional details of an audio information processing system according to the present invention.

FIG. 2A is a block diagram illustrating the functional details of the audio information processing system according to the present invention. An AIPS 205 (some or all of elements shown within each of the AIPS components 135, 137, 139, 141, and 143 of FIG. 1) comprises an analog to digital converter (A/D) 208, audio signal separation circuitry 209, voice signal processing circuitry 211, background signal processing circuitry 213, and signal combining circuitry 215.

Audio input 207 is received from the STB 113, videodisk player 133, PVR 139, television 115 and other local and remote sources. If the audio input 207 is received in an analog form, the A/D converter 208 converts the audio to a digital form. If the audio input 207 is received in a segregated form, the background signals are sent to the background signal processing circuitry 213 while the voice signals are sent to the voice signal processing circuitry 211. Digital, unsegregated audio is delivered to the audio signal separation circuitry 209.

The audio signal separation circuitry 209 segregates or separates the voice signal and the background signal from the unsegregated digital audio received via the audio input 207 or A/D converter 208. The separation of voice signal from the background sound signal itself is done by at least one of the many approaches available in each AIPS. The first, among these many approaches, is that of correlating multiple language tracks available with some of the audio-video program inputs (explained in detail in the description of FIG. 2B). The second choice involves use of correlating center channel of a surround sound audio input with that of rest of the channels available (explained in detail in the description of FIG. 4). The third choice available in separation of voice from background involves use of voice detection circuitry (explained in detail in the description of FIG. 3). Although any one of the three choices of techniques for signal separation may be used independently, the AIPS 205 simultaneously applies multiple of the three choices to verify and improve the separation of voice from background when possible (i.e., where the corresponding required audio inputs are available).

As an example of simultaneous use of multiple of the three separation techniques, the audio signal separation circuitry 209 may receive both multiple language tracks each in a surround sound audio format. The audio separation circuitry 209 employs both techniques of separation, that is, correlation between multiple language tracks and correlation between center channel of surround sound audio input with rest of the channels of surround sound audio input, for the purpose of improving and verifying successful separation of voice from the background.

The voice signal is processed using voice signal processing circuitry 211 to vary a plurality of user controlled audio characteristics such as the signal strength (control of volume level), special effects and the signal equalization. The voice signal processing circuitry 211 also applies processing designed to enhance the voice signal that are not user controllable, such as particular filters that remove unwanted or inappropriate frequency components.

Similarly, the background signal is processed using background signal processing circuitry 213 to vary a plurality of user controllable characteristics targeting only the background signal that are independent of the controllable characteristics of the voice signal. Such controllable characteristics also include, for example, equalization, special effects (such as surround sound processing) and signal strength. As with voice, uncontrollable audio processing, such as filtering that targets only the background signal, is also employed.

The processed voice signal produced by the voice signal processing circuitry 211 and the background signal processing circuitry 213 are then combined by signal combining circuitry 215. The combined audio signal produced by the signal combining circuitry 215 has an overall signal strength determined from the processed voice signal and the processed background signal as modified by a user's volume control setting. The processed digital audio signal is then sent to audio presentation device(s) such as speakers, headphones, the surround sound system 125, or the television 115 for presentation to a user or to the PVR 117 for storage. Although not shown, a digital to analog converter may be added to the AIPS 205 to permit processed audio output in an analog form to support analog versions of the audio presentation devices 217.

To support dual (voice and background) input types of the audio presentation devices 217, the processed voice signal produced by the voice signal processing circuitry 211 and the processed background signal produced by the background signal processing circuitry 213 are provided to the audio presentation device(s) 217 with or without analog to digital conversion as required. In such case, the audio presentation device(s) 217 may further separately process these signals for presentation or may separately store these processed signals.

Figure 2B:
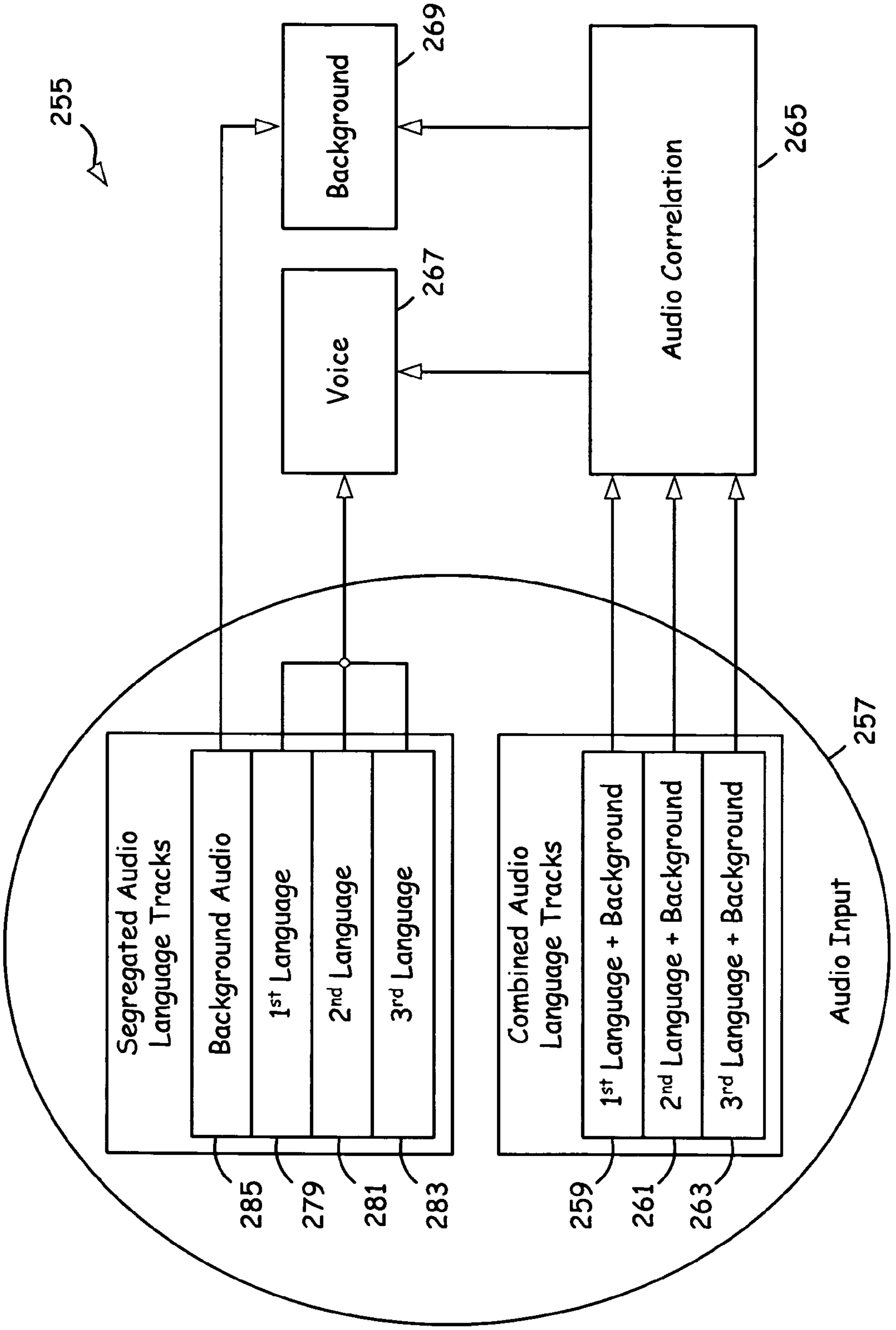
FIG. 2B is a block diagram illustrating a process for the separation of a voice signal and a background signal from a multi-language input signal, in an audio information processing system according to the present invention.

FIG. 2B is a block diagram illustrating a process for separation of voice signal and background signal from multi-language input signals, in an audio information processing system according to the present invention. AIPS multi-language processing 255 is activated when at least two language tracks of audio input 257 are available. For example, an audio correlation unit 265 receives three tracks of combined voice and background audio wherein each track contains voice spoken in a different language from that of others. More particularly, some types of audio delivered to the audio correlation unit 265 via the audio input 257 include a 1$^{st}$ language track 259, 2$^{nd}$ language track 261, and 3$^{rd}$ language track 263. Each of the language tracks 259, 261 and 263 contain an audio signal with unsegregated voice and background. For example, the 1$^{st}$ language track 259 might contain English voice and background audio, while the other tracks contain French and German. The audio correlation unit 265 processes the language tracks 259, 261, and 263 to identify and separate the voice signal 267 and the background signal 269.

The AIPS 205 may also receive other types of audio wherein the different languages and background are already separated. For example, the audio input 257 may be segregated audio language tracks including language tracks 279, 281 and 283 that do not include background audio. Instead, a separate track or a background audio track 285 is available. Because segregation in this situation has already occurred, the processing 255 merely involves forwarding at least one of the tracks 279, 281 and 283 as the voice signal 267, and forwarding the background audio track 285 as the background signal 269.

Thus, the AIPS first determines if the audio input 257 includes a multiple language tracks. If so and if the multiple language tracks are unsegregated, the AIPS divides the combined audio language tracks of the audio input 257 into the respective language tracks 259, 261 and 263. The audio correlation unit 265 receives the multiple language tracks 259, 261, and 263 as its input and correlates at least two of these audio tracks in producing the voice signal 267 and the background signal 269. Generally, the only sound component that is different in each of the multi language tracks is that of the voice component, the background sound being similar if not the same in all of the multi language tracks 259, 261, and 263. The audio correlation unit 265 digitally correlates these multi language input signals and separates voice 267 signal from background 269 signal. The audio correlation unit 265 employs digital signal processing functions of auto correlation or cross correlation depending on the situation.

For example, television broadcasts and DVD stored media's often either provide independent and combined audio-video for each language or may provide a single video stream with combined multiple language audio tracks. The AIPS described in FIG. 1 and FIG. 2B will handle both of these possibilities as the case may be. More specifically, the audio language tracks 259, 261 and 263 may be that of multi language movie tracks available in European countries. The audio input 257 may come from the set top box, television and a surround sound system. The set top box receives signals from an external antenna or signals via satellites using dish antenna (as illustrated in FIG. 1). Similarly, the multi language track signal input 257 may come from the storage units such as movie tapes or digital videodisks, when used in videodisk players or personal video recorders.

Figure 3:
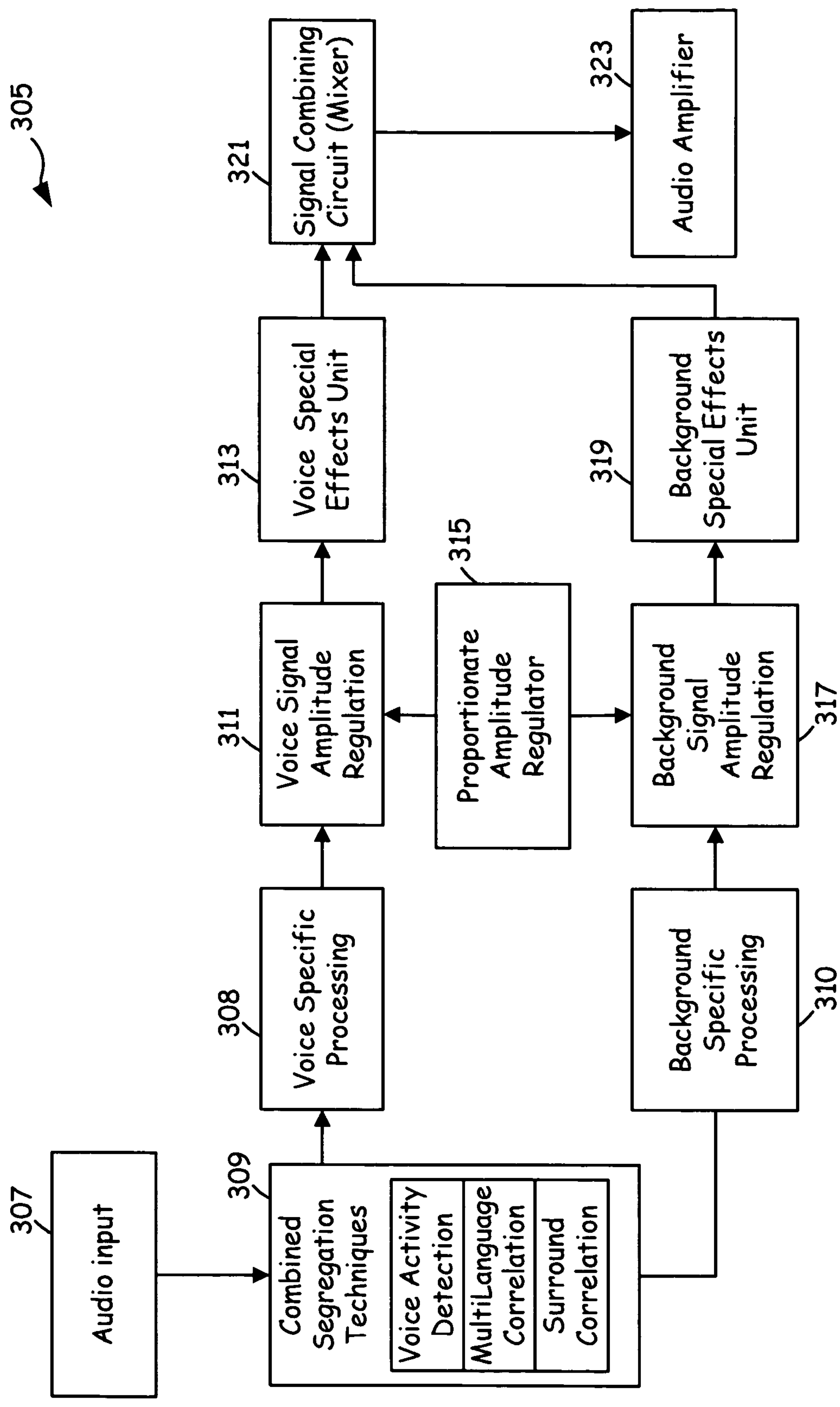
FIG. 3 is a block diagram illustrating circuitry involved in the separating voice signal and the background signal and in processing these signals separately according to the present invention.

FIG. 3 is a block diagram illustrating circuitry involved in separating voice signal and background signal and processing these signals separately according to the present invention. With this embodiment, the AIPS receives an audio input 307 and includes combined segregation circuitry 309, such as voice detection and multi-language and surround sound correlation circuitry, a voice specific processing unit 308, a background specific processing unit 310, a voice signal amplitude regulation unit 311, a background signal amplitude regulation unit 317, a proportionate amplitude regulator 315, a voice special effects unit 313, a background special effects unit 319, a signal combining circuit (mixer) 321 and an audio amplifier 323. The audio input 307 may come from any of the home audio-video system components previously described with reference to FIG. 1.

The voice detection circuitry of the combined segregation circuitry 309 processes the audio input 307 to produce the voice signal and the background signal. The voice detection circuit of the combined segregation circuitry 309 employs digital signal processing means of auto correlation and cross correlation in order to separate the voice signal from the background signal. Typical examples of voice detection circuitry of the combined segregation circuitry 309 can be found in conventional cellular telephone circuitry and program code.

Although unnecessary, all of the techniques for separating voice and background explained herein are used in combination with the voice detection circuitry of combined segregation circuitry 309. For example, if multiple language tracks our surround sound signals are available, the results of the voice detection circuitry can be verified within every AIPS.

Some AIPS can be scaled down to include at least one but less than all of the aforementioned segregation techniques. Other AIPS might include all but only use one at a time depending on available audio input content. And although a goal of some AIPS is to separate all voice audio from all background audio, such separation in other AIPS might involve merely an identification of time periods of audio that contain voice (whether with or without overlapping background audio) and periods that contain only background—not addressing the separation of overlapping background audio. Other APS embodiments will separate the overlapping background.

The output of combined segregation circuit 390 is the voice signal and the background signal, and they are respectively fed to the voice specific processing unit 308 and the background specific processing unit 310. Both of the processing units 308 and 310 include processing functionality tailored for the type of audio being processed. For example, the voice specific processing unit 308, in one embodiment, comprises a filter that attempts to decrease the signal strength of audio that occurs outside of a typical voice frequency range. Similar filtering tailored for background audio comprises part of the corresponding background specific processing unit 310. The outputs of the specific processing units 308 and 310 are respectively delivered to a voice signal amplitude regulation unit 311 and background signal amplitude regulation unit 317. The proportionate amplitude regulator unit 315 receives input from a user via the home audio-video system in consideration or from a home audio-video system compatible remote control. The proportionate amplitude regulator unit 315 sends amplitude control signals (voice level control and background level control settings) received from a user and sends them to voice signal amplitude regulation unit 311 and background signal amplitude regulation unit 317. The proportionate amplitude regulator 315 decides on the proportionate amplitude levels of voice signal and background signal. The voice signal amplitude regulation unit 311 and the background signal amplitude regulation unit 317 adjust the respective signal strengths in accordance with the level setting inputs received from the proportionate amplitude regulator 315.

The voice special effects unit 313 and background special effects unit 319 apply equalization and enhanced special effects such as appearance of sound in a concert hall independently on the respective signal inputs. The voice special effects unit 313 and background special effects unit 319 employ digital signal processing means in order to provide equalization and special effects. The signal combining unit (mixer) 321 combines the processed voice signal and the background signal, with proportionate amplitudes as per user settings, and sends it to audio amplifier unit 323. The audio amplifier unit 323 (which is not a part of audio information processing system but a part of the home audio-video system) amplifies the received signal from the signal combining circuit 321 and sends the processed signal to audio presentation devices such as speakers or head phones.

In accordance with an embodiment of the present invention, the audio input 307 may come from home audio-video system components such as STB, PVR, TV, surround sound systems, or videodisk players. The audio information processing system, which is built in to the above mentioned home audio-video systems, may comprise circuitries of combined segregation circuitry 309, voice signal amplitude regulation unit 311, background signal amplitude regulation unit 317, proportionate amplitude regulator unit 315, voice special effects unit 313, background special effects unit 319 and signal combining unit 321. The entire home audio-video systems with built in AIPS may have buttons or a remote control to provide settings of proportionate volume levels for voice and background signals as well as equalization and special effects.

Figure 4:
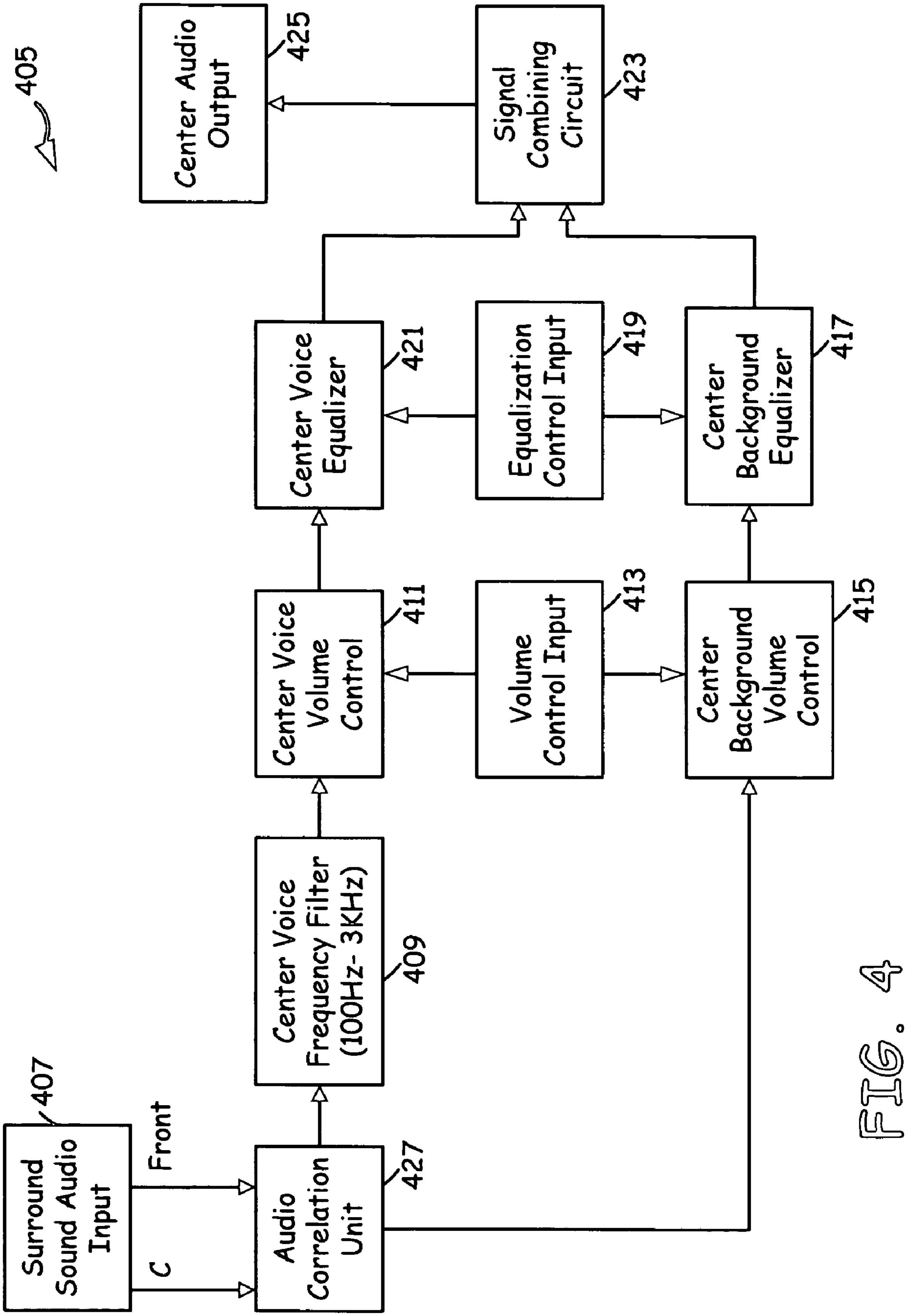
FIG. 4 is a block diagram illustrating the regulation of volume and equalization of voice and background independently as per user settings, considering a center channel of a surround sound system according to the present invention.

FIG. 4 is a block diagram illustrating the regulation of volume and equalization of voice and background independently as per user settings, considering center channel of a surround sound system according to the present invention. The components/operations shown in FIG. 4 are a part of an AIPS when incorporated in a home audio-video system with surround sound audio presentation such as that described in FIGS. 1-3. These components/processing include a surround sound audio input 407 and include an audio correlation unit 427, a center voice frequency filter 409, a center voice volume control 411, a center voice equalizer 421, a center background volume control 415, a center background equalizer 417, volume control input 413, equalization control input 419, a signal combining circuit 423 and a center audio output 425.

The surround sound audio input 407 provides a multi channel input to the audio correlation unit 427, out of which the audio signals from center channel and at least one of the multiple surround sound channels available are forwarded to the audio correlation unit 427. The audio correlation unit 427 employs the signal processing functions of auto correlation or cross correlation to extract the voice signal and the background signal. It should be noted here that, the multiple techniques of separation where applicable, as explained with reference to FIG. 2*a*, is available in each and every AIPS and are appropriately made of use. The voice signal is further filtered (100 Hz-3 KHz) using center voice frequency filter 409 to remove unwanted frequency spectrum components.

The voice signal from the filter 409 is provided as input to the center voice volume control unit 411 and the background signal from the audio correlation unit 427 is forwarded as input to the center background volume control unit 415. The volume control input unit 413 receives user input from a remote control or buttons in a surround sound system and provides control signals representing the desired volume to the center voice volume control unit 411 and center background volume control unit 415 respectively. The center voice volume control unit 411 controls the volume of voice signals in accordance with the input from volume control unit 413. Similarly, center background volume control unit 415 adjusts volume of background signals as desired by the user.

The equalization control input unit 419 provides equalizer control signals to center voice equalizer unit 421 and the center background equalizer unit 417 based on the user settings. The center voice equalizer 421 provides spectral amplitude variations to the voice signal with in the audio frequency spectrum based on the received control signals from the equalization control input unit 419. Similarly, center background equalizer unit 417 provides spectral amplitude variations on the entire audio frequency spectrum based on the user settings (as per the equalizer control signals received from the equalization control input unit 419). The independently processed signals of voice and background signals from units 421 and 417 are combined using signal combining unit 423. The center audio output unit 425 provides the output of the audio information processing system to the preexisting units of the surround sound system such as power amplifiers.

In accordance with an embodiment of the present invention, the block diagram shown in FIG. 4 represents a part of the AIPS as applied to the independent processing of voice and background signals of a center channel and front channel source. Similar processing circuitry may be applied to each of the other audio channels of a multi channel input of a surround sound audio input in order to separate the incoming audio signal(s) into the voice signal and the background signal. For example, the surround sound audio input 407 may be that of a surround sound system providing surround sound output from one of the many possible sources such as a STB, television, videodisk player or a compact disk player. The processed audio output 425 may appear as output via a transducer such as a surround sound multi-speakers or headphones. The processed audio output 425 signals will have volume and equalization levels of voice and background signals as desired by the user. For example, if user sets a voice volume level of 80% and background volume level of 20% with desired equalization controls, the final output in speakers will represent such a signal with high voice sound output and low background sound output in all of the multi channel surround sound speakers. All the surround sound special effects and variations in the sound output of speakers will remain the same.

The independent processing of voice and background signals may include independent controls of levels of at least some of volume, bass, treble, equalization, differing surround sound effect, differing settings on speaker by speaker basis or other special effects as being used. For example, the voice sound output may have full volume at center, half volume on left and right, and 10% full volume at rear, with no speaker to speaker delay; or the voice may have two times the volume of background and low bass, high treble, and differing internal filters and equalizers to optimize voice. At the same time regarding the background audio, the user may use a reverberating bass special effect, 10% full background volume on center, 70% on left and right, 20% on left rear, and 40% on right rear, heavy bass, light treble, heavy surround sound channel delays and special effects on rear channels, medium on left and right, and light on center. In case of equalization, there is no need for bass and treble controls, as equalization provides control of signal strength over the entire audio spectrum. The equalization setting may also provide user control over entire spectrum on each individual channel of a surround sound system, however, it may not be desirable as too many controls may make it hard to set or may confuse the user. Further, some of the processing controls may not be available to the user, as they may be predefined. These controls may be provided to the user by way of buttons on the remote control and its display, or the buttons in the system itself and using the television screen as a display.

Figure 5B:
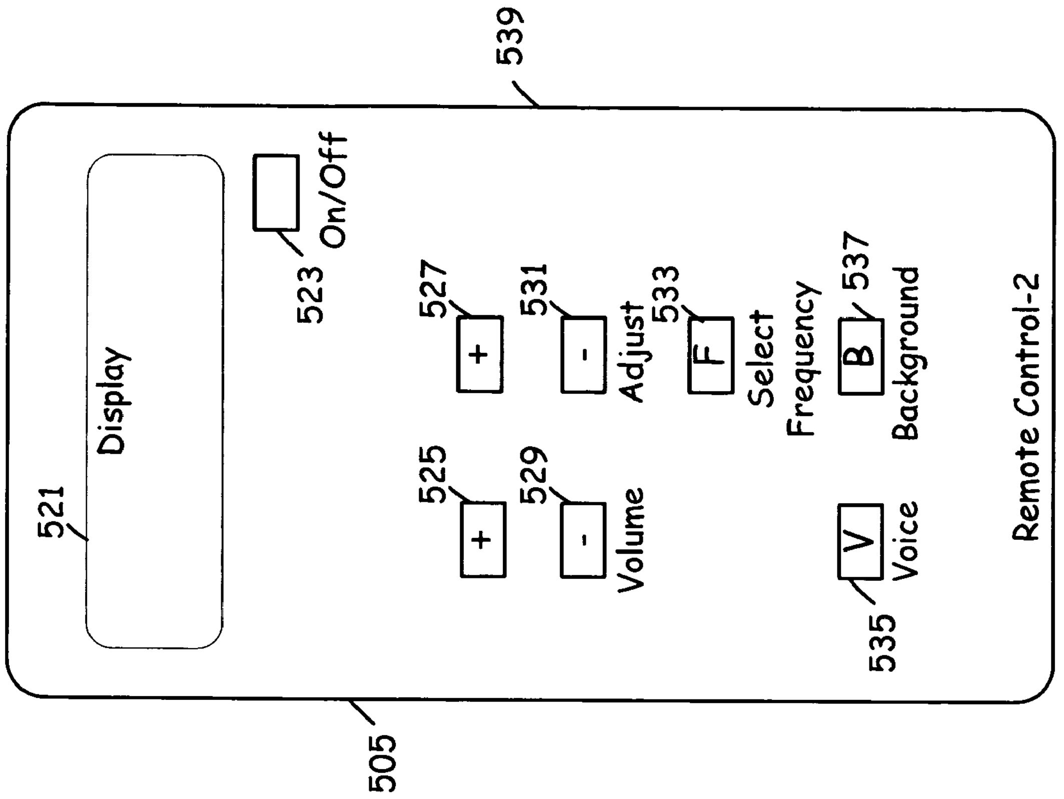
FIGS. 5A and 5B are block diagrams illustrating two remote controls which facilitate independent volume control and equalization settings for voice and background signals, according to embodiments of the present invention.
Figure 5A:
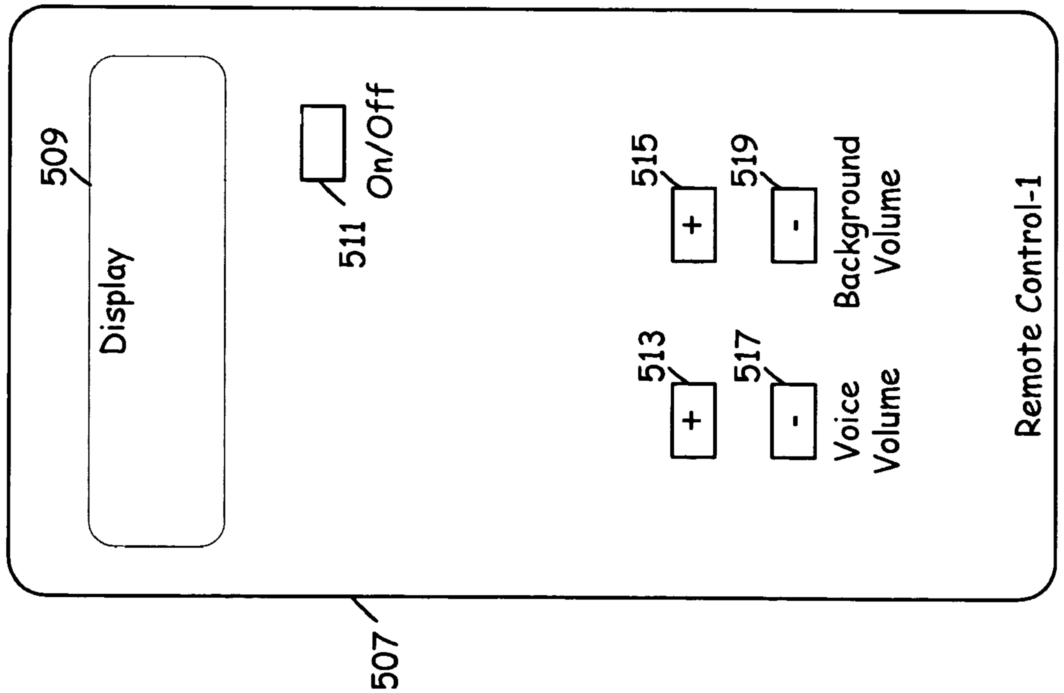

FIGS. 5A and 5B are block diagrams illustrating two remote controls, which facilitate independent volume controls and equalization settings for voice and background signals, according to embodiments of the present invention. Referring first to FIG. 5A, remote control 507 includes a display 509, on/off button 511, and independent volume control buttons 513, 517 and 515, 519 for voice and background sound output respectively. Referring now to FIG. 5B, in accordance with another embodiment of the present invention, remote control 539 includes a display 521, on/off button 523, volume control buttons 525, 529, voice mode switch 535, background mode switch 537, equalizer frequency select button 533, and equalizer spectral amplitude adjust buttons 531, 537.

Referring to FIG. 5A, remote control 507 provides controls for the basic functionality of the AIPS. Remote control 507 has a display 509, which displays the status of the home audio-video system in consideration such as whether the volume level being controlled is that of voice signal or background signal and level of the volume itself. The button 511 allows user to switch on or switch off the home audio-video system. The user controls the volume of voice signals by pressing button 513, which increases the voice volume, or by pressing button 517, which decreases the voice volume. The status of voice volume appears on the display 509 as the user controls the voice volume using buttons 513, 517. Similarly, the user increases or decreases the volume level of background signal by pressing either button 515 or button 519 and the volume status appears on the display 509. The display 509 allows user to know what is being controlled and the status of the function being controlled.

Referring to FIG. 5B, remote control-2 539 provides controls of volume level of voice and background signals as well as equalizations, independent of each other. The display 521 indicates the buttons being pressed, the volume level of voice or background signal and frequency selected, and the level of amplitude adjusted among other things. The on/off button 523 switches on or off the device. When the voice button 535 is pressed, it selects the voice as the function being controlled and the voice label appears on the display 521. The volume buttons 525 and 529 control the level of the voice signal level, once voice button 535 is pressed. The frequency select button 533 selects the frequency, the level of which needs to be adjusted, and the frequency appears on the display 521. The adjust buttons 531 and 527 increase or decrease the amplitude level of the frequency being selected. Similarly, when background switch 537 is pressed, the volume buttons 525, 529 controls the volume level of the background signal, and the equalizer buttons 533, 531 and 527 control the equalization functionality of the background signal.

The remote controls 507 and/or 539 may be the control provided in conjunction with a surround sound system. In this case, the remote control 507 or 539 allows user to separately control the volume levels (or levels of audio frequency selected, in case of equalization) of voice and background sound output. The remote controls 507 or 539 may come with many other buttons (not shown in FIGS. 5A and 5B) which provide the usual controls based on the functionality of the existing home audio-video system.

Figure 6:
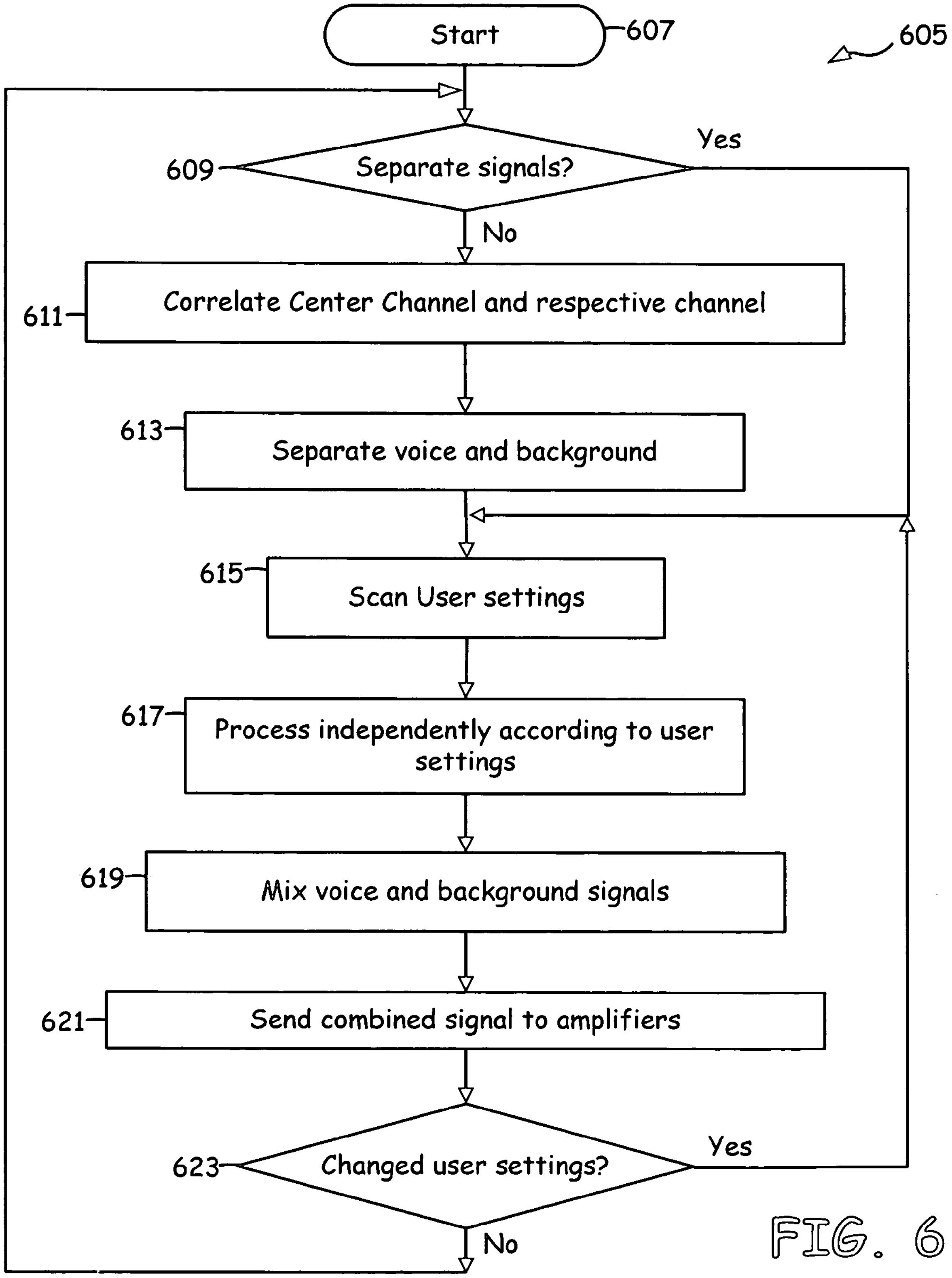
FIG. 6 is a flow diagram illustrating the method involved in regulation of volume of voice and background sound in an audio information processing system according to the present invention.

FIG. 6 is a flow diagram illustrating the method involved in regulation of volume of voice and background sound in an audio information processing system according to the present invention. The method of audio information processing system separating and processing incoming audio signal starts at block 607 with the system receiving the audio input from a home audio-video system, considering a surround sound system as an example.

Then at the next decision block 609, the incoming signal is verified to find out if the voice and background signals are received separately. If not, at the next block 611, the center channel signal is correlated with the respective channel. Then the voice and the background signals are separated at the next block 613. The separation process involves auto correlation or cross correlation or any other techniques of voice detection, in blocks 611 and 613.

If at decision block 609, it is determined that the voice and background signals have arrived separately, then the audio information processing system directly jumps to the step of scanning user settings at the next block 615. The scanning of user settings involves retrieving control signals stored in memory regarding volume levels and equalization settings of voice signals and background signals. These control signals are provided by the user by way of pressing buttons in the home audio-video system or a remote control; these control signals are stored in a memory location.

Then, at the next block 617, the voice and the background signals are independently processed for volume level and equalization settings. The control signals for the volume level and the equalization settings are provided independently based on the user settings. At block 617, all other signal processing desired such as enhanced special effects are provided as well, independently for voice and background signals. Then, these two processed signals and mixed at the next block 619. The combined or mixed signals will have user desired volume levels together with desired equalization settings and special effects settings for voice and background signals.

Then at the next block 621, the signals are sent through the usual channels pre-existing in the home audio-video systems such as power amplifiers. The power amplifiers are not part of the audio information processing systems. Then at the next decision block 623, it is determined if the user settings of volume level and the equalization settings are changed. If yes, the user settings are again scanned at the block 615 and the steps of blocks 617, 619 and 621 are repeated. The entire method of determining the nature of the incoming signals, separating the voce and background signals and processing them independently, as depicted in 605 repeats itself continuously.

Figure 7:
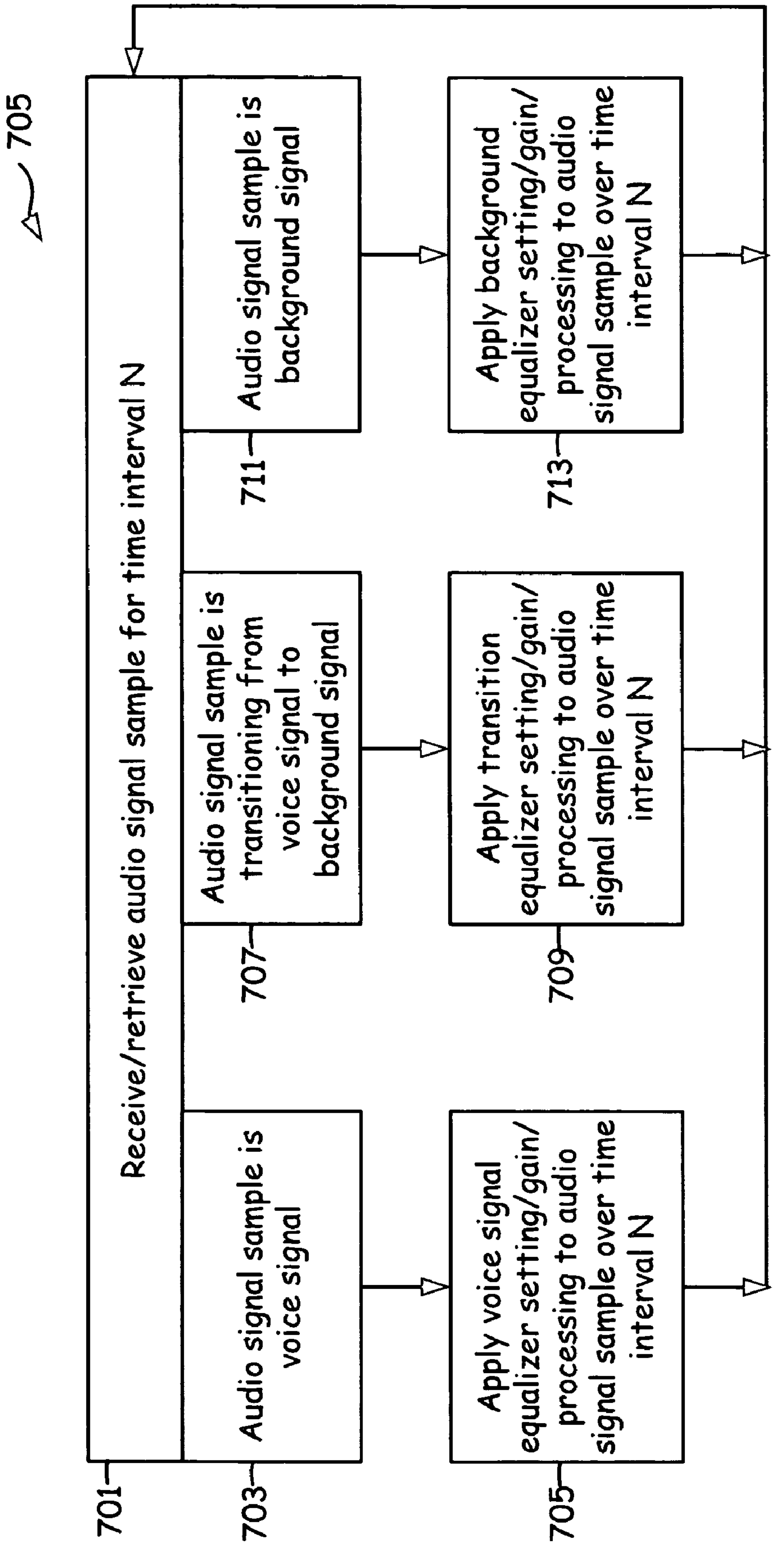
FIG. 7 is a flow chart illustrating a method involved in the separation of voice and background signals when the audio signal input is a determined voice signal, a determined background signal or a transition period according to the present invention.

FIG. 7 is a flow chart illustrating the method involved in separation of voice and background signals when the audio signal input is a voice signal, background signal or a transition period according to the present invention. The method 705 of audio information processing system receiving or retrieving audio signal sample for the time interval N starts at block 701.

The retrieved audio signal sample is determined as a voice signal at block 703. During this time interval of N, at block 703, it is clearly determined that the separated signal is that of voice without any ambiguity and at block 705 digital signal processing schemes are applied. At block 705, the gain, equalizer setting, and processing of the voice signal are done for a time interval of N.

At block 707, for a time interval of N, it is determined that the retrieved signal is transitioning from voice signal to background signal or vice versa. During this period of time interval N, there is an ambiguity between voice and background signals and no clear separation between them is possible. At block 709, a preset transition gain, transition equalizer setting and other signal processing is applied to the audio signal sample over time interval N.

The retrieved audio signal sample is determined as background signal at the block 711, during the time interval N. During this period, the retrieved audio signal sample is background signal with out any ambiguity. At block 713, background gain, equalizer settings, and other processing are applied during the time interval N. This process continuously repeats as the audio information processing system retrieves more audio signal samples.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An audio processing system comprising:

audio signal separation circuitry that receives an audio signal that includes a plurality of language tracks of differing languages and that segregates the audio signal into a voice signal and a background signal based on a correlation of two or more of the plurality of language tracks;

voice signal processing circuitry that separately processes the voice signal to produce a processed voice signal; and background signal processing circuitry that separately processes the background signal to produce a processed background signal.

2. The audio information processing system of claim 1, wherein:

the voice signal processing circuitry applies a voice level control setting to the voice signal when processing the voice signal; and the background signal processing circuitry applies a background level control setting to the background signal when processing the background signal.

3. The audio information processing system of claim 1, wherein:

the voice signal processing circuitry performs first equalization operations when processing the voice signal; and the background signal processing circuitry performs second equalization operations when processing the background signal.

4. The audio information processing system of claim 1, wherein:

the voice signal processing circuitry performs first surround sound processing operations when processing the voice signal; and the background signal processing circuitry performs second surround sound processing operations when processing the background signal.

5. The audio information processing system of claim 1, further comprising signal combining circuitry that combines the processed voice signal with the processed background signal to produce a processed output audio signal.

6. The audio information processing system of claim 1, wherein:

each of the plurality of language tracks includes combined voice and background content; and segregating the audio signal into a voice signal and a background signal comprises:

correlating the plurality of language tracks to produce the background signal; and removing the background signal from a selected language track to produce the voice signal.

7. The audio information processing system of claim 1, wherein:

the plurality of language tracks include a plurality of respective language voice tracks and a background audio track; and processing the plurality of language tracks comprises:

processing the plurality of respective language voice tracks to produce the voice signal; and obtaining the background signal from the background audio track.

8. The audio information processing system of claim 1, wherein:

the audio signal comprises a plurality of audio channels including a center channel and at least one surround channel;

the audio signal separation circuitry produces the voice signal using the center channel; and the audio signal separation circuitry produces the background signal using the at least one surround channel.

9. The audio information processing system of claim 1, the audio signal separation circuitry comprises voice detection circuitry that processes the audio signal to produce the voice signal and the background signal.

10. The audio information processing system of claim 1, further comprising:

a control input operable to select a voice signal volume level separate from a background signal volume level;

the voice signal processing circuitry operable to separately process the voice signal to produce the processed voice signal based upon the voice signal volume level; and the background signal processing circuitry operable to separately process the voice signal to produce the processed background signal based upon the background signal volume level.

11. The audio information processing system of claim 10, further comprising a remote control operable to receive input from a user and to produce the voice signal volume level and the background signal volume level to the voice signal processing circuitry and the background signal processing circuitry.

12. The audio information processing system of claim 1, wherein:

the voice signal processing circuitry processes the voice signal based upon first input received from a user; and the background signal processing circuitry processes the background signal based upon second input received from the user.

13. The audio information processing system of claim 12, wherein the first input comprises a volume control setting.

14. The audio information processing system of claim 12, wherein the first input comprises a frequency adjustment setting.

15. An audio information processing system that facilitates regulation of background sound against voice, comprising:

a voice detection circuit operable to receive an audio signal having a plurality of voice tracks in differing languages and background components, the voice detection circuit operable to statistically filter the audio signal to produce a voice signal and a background signal from the audio signal based on a correlation of two or more of the plurality of voice tracks;

a proportionate amplitude regulator operable to independently and proportionately regulate the amplitude of the voice signal and the background signal;

a voice special effects unit operable to apply voice special effects to the voice signal;

a background special effects unit operable to apply background special effects to the background signal; and a mixer operable to combine the voice signal and the background signal.

16. The audio information processing system of claim 15, wherein the voice detection circuit is operable to separate the voice signal and the background signal from the audio signal by employing digital signal processing means of auto correlation and cross correlation between a plurality of audio channels available.

17. The audio information processing system of claim 15, wherein the proportionate amplitude regulator is operable to automatically adjust signal strengths of the voice signal and the background signal based upon user inputs received via either a remote control or buttons on a control unit.

18. The audio information processing system of claim 15, wherein the voice special effects unit is operable to provide independent enhanced special effects and equalization to the voice signal and the background signal using digital signal processing as per user settings in a remote control or buttons in a receiver.

19. The audio information processing system of claim 15, wherein:

the proportionate amplitude regulator processes the voice signal based upon first input received from a user; and the proportionate amplitude regulator processes the background signal based upon second input received from the user.

20. The audio information processing system of claim 19, wherein the first input comprises a volume control setting.

21. The audio information processing system of claim 19, wherein the first input comprises a frequency adjustment setting.

22. A method for processing audio information comprising:

receiving an audio signal that includes a plurality of language tracks of differing languages;

segregating the audio signal into a voice signal and a background signal based on a correlation of two or more of the plurality of language tracks;

processing the voice signal to produce a processed voice signal; and separately processing the background signal to produce a processed background signal.

23. The method of claim 22, wherein:

processing the voice signal to produce a processed voice signal includes applying a voice level control setting to the voice signal when processing the voice signal; and separately processing the background signal to produce a processed background signal includes applying a background level control setting to the background signal.

24. The method of claim 22, wherein:

each of the plurality of language tracks includes combined voice and background content; and segregating the audio signal into a voice signal and a background signal comprises:

correlating the plurality of language tracks to produce the background signal; and removing the background signal from a selected language track to produce the voice signal.

25. The method of claim 22, wherein:

wherein receiving the audio signal comprises receiving a center channel and at least one surround channel; and segregating the audio signal into the voice signal and the background signal comprises correlating the center channel with the at least one surround channel to produce the voice signal and the background signal.

26. The method of claim 22, wherein:

wherein receiving the audio signal comprises receiving a center channel and at least one surround channel; and segregating the audio signal into the voice signal and the background signal comprises:

producing the voice signal based upon the center channel; and producing the background signal based upon the at least one surround channel.

27. The method of claim 22, further comprising:

receiving first and second inputs from a user;

processing the voice signal based upon first input; and processing the background signal based upon the second input.

28. The method of claim 27, wherein the first input comprises a volume control setting.

29. The method of clam 27, wherein the first input comprises a frequency adjustment setting.

30. The method of claim 22, wherein:

the plurality of language tracks include a plurality of respective language voice tracks and a background audio track; and processing the plurality of language tracks comprises:

processing the plurality of respective language voice tracks to produce the voice signal; and obtaining the background signal from the background audio track.

* * * * *